United States Patent
Vogel et al.

(10) Patent No.: US 7,266,964 B2
(45) Date of Patent: Sep. 11, 2007

(54) DATA CENTER ROOM COLD AISLE DEFLECTOR

(75) Inventors: Marlin R. Vogel, Cupertino, CA (US); Shlomo Novotny, Wayland, MA (US); Mario Lee, Santa Clara, CA (US)

(73) Assignee: SUN Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/794,730

(22) Filed: Mar. 4, 2004

(65) Prior Publication Data

US 2005/0193761 A1    Sep. 8, 2005

(51) Int. Cl.
F25D 23/12 (2006.01)
F25D 17/04 (2006.01)
H05K 7/20 (2006.01)
H05K 5/00 (2006.01)
F24F 7/10 (2006.01)
F24F 13/06 (2006.01)

(52) U.S. Cl. .................. 62/259.2; 62/407; 361/694; 454/184; 454/307

(58) Field of Classification Search ................ 62/259.2, 62/265, 407; 361/694; 454/184, 307
See application file for complete search history.

(56) References Cited

U.S. PATENT DOCUMENTS

| | | | | |
|---|---|---|---|---|
| 1,955,374 A | * | 4/1934 | Cobb et al. ........... 34/191 |
| 2,163,182 A | * | 6/1939 | Warren et al. ........... 62/266 |
| 2,346,931 A | * | 4/1944 | Mann ............... 62/62 |
| 2,780,923 A | * | 2/1957 | Jones ............... 62/78 |
| 3,453,839 A | * | 7/1969 | Sabin ............... 62/239 |
| 5,468,184 A | * | 11/1995 | Collier ............... 454/186 |
| 5,544,012 A | * | 8/1996 | Koike ............... 361/695 |
| 5,671,805 A | * | 9/1997 | Stahl et al. ............... 361/695 |
| 5,718,628 A | * | 2/1998 | Nakazato et al. ........... 454/184 |
| 6,374,627 B1 | * | 4/2002 | Schumacher et al. ....... 62/259.2 |
| 6,557,357 B2 | * | 5/2003 | Spinazzola et al. ........... 62/89 |
| 6,574,104 B2 | * | 6/2003 | Patel et al. ............... 361/695 |
| 6,672,955 B2 | * | 1/2004 | Charron ............... 454/184 |
| 6,775,997 B2 | * | 8/2004 | Bash et al. ............... 62/180 |
| 6,859,366 B2 | * | 2/2005 | Fink ............... 361/690 |
| 6,862,179 B2 | * | 3/2005 | Beitelmal et al. ........... 361/687 |

* cited by examiner

*Primary Examiner*—William C Doerrler
(74) *Attorney, Agent, or Firm*—Chapin IP Law, LLC; Barry W. Chapin, Esq.

(57) ABSTRACT

A method and system of deflecting air circulated in a data center room are disclosed. A method for controlling air circulation within a room having an aisle between racks with computer systems mounted thereon comprises supplying cooling air to computer systems in the racks via holes in a floor of the room and using a deflector to reduce flow of cooling air along the aisle toward an air intake of a cooling unit without passing the computer systems.

22 Claims, 3 Drawing Sheets

DATA CENTER ROOM COLD AISLE DEFLECTOR

FIELD OF THE INVENTION

The present invention relates to the field of design of a data center room; more particularly, the present invention relates to deflecting air circulated in a data center room.

BACKGROUND OF THE INVENTION

A data center room consists of an enclosed area where many computer systems such as servers, databases, and power supplies are located. Design of a data center room often requires both access to and from the computer systems, and incorporation of one or more ways to control the temperature within the data center room. Elevated air temperatures within the data center room may adversely affect a computer system's reliability, and may result in systems shutting down.

The computer systems are often physically mounted in racks in a data center room. Multiple rows of racks may be arranged in a data center room, so long as the layout allows for access, typically through an aisle, to both the front and back of each rack. The aisle is referred to as a cold aisle, because in addition to providing access to the computer systems, the cold aisle is the area where cooling air is dispersed in order to cool the computer systems.

A typical air cooling system for a data center room consists of an air intake area, an air cooling unit, and a cooling air passageway leading to the vicinity of the racks. Air from the data center room is drawn into the air intake area and directed to the air cooling unit (e.g., an air conditioning device). The air cooling unit cools the air and then directs the cooled air into the cooling air passageway, generally comprising an area under the floor of the data center room. The cooling air is dispersed from the cooling air passageway to the racks by passing through perforations in the floor. These perforations are located throughout the data center room, including the cold aisles. Once the cooling air is dispersed, it is free to circulate in the area of the racks.

For compliance with fire safety codes, the racks and the cold aisles are often arranged to allow efficient and safe access through the cold aisles by persons in the room. In this case neither end of a cold aisle is permanently obstructed. This generally requires a layout of cold aisles where the ends of the aisles are free of permanent obstructions, such as a wall.

One problem with current data center designs is that the cooling air, once released, circulates based on the air pressures and air currents within the data center room. In some instances, instead of flowing up to all the computer systems in the racks, the air may flow down one or more of the cold aisles and out of an open end of a cold aisle, returning directly to the air intake of the cooling unit. In this instance, the cooling air may never reach the computer systems it was intended to cool, and the computer systems may draw heated air into their own cooling systems, thereby increasing the danger of overheating, leading to reduced reliability, or a shutdown of the computer systems. That is, heated air exhausted by or radiated from one computer system in the rack is re-circulated back into the same or other computer systems in the rack. The heated air traveling back towards the air intake of the cooling unit may re-circulate back to the computer systems by re-entering a cold aisle through one of the aisles.

In addition, the air cooling unit, which has a fixed capacity to circulate a volume of air, is receiving and processing cooled air, which displaces the heated air in the data center room, and prevents the heated air from being cooled by the air cooling unit. This reduces efficiency of the cooling system for the data center room, and adds to the cost of cooling the data center room, either by requiring sizing of an air cooling unit with an over capacity for volume or by requiring a properly sized air cooling unit to run more often or continuously.

SUMMARY OF THE INVENTION

A method and system of deflecting air circulated in a data center room are disclosed. In one embodiment, the method for controlling air circulation comprises supplying cooling air to computer systems in racks in the room via holes in a floor of the room and using a deflector to reduce flow of cooling air along the aisle toward an air intake of a cooling unit without passing the computer systems.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A method and a system are disclosed herein for controlling the flow of air that is circulating within a data center room. By deflecting air flow in a cold aisle so that the air does not move directly down the cold aisle and into the air intake of a cooling unit for the data center room, the cooling air is forced to flow through the rack, and the heated air exhausted by a device (e.g., a computer system) in a rack is less likely to be drawn into another device. The result is a reduction of the air temperatures taken in at the air intake of the devices in the racks, resulting in increased reliability of the devices, and a reduction in the likelihood of a shutdown of the devices.

In addition, deflecting the air flow in a cold aisle may reduce initial costs by allowing a less expensive cooling system to be installed in the data center room, and may increase the operating efficiency and thus lower the cost of operating the cooling system.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Figure 1:
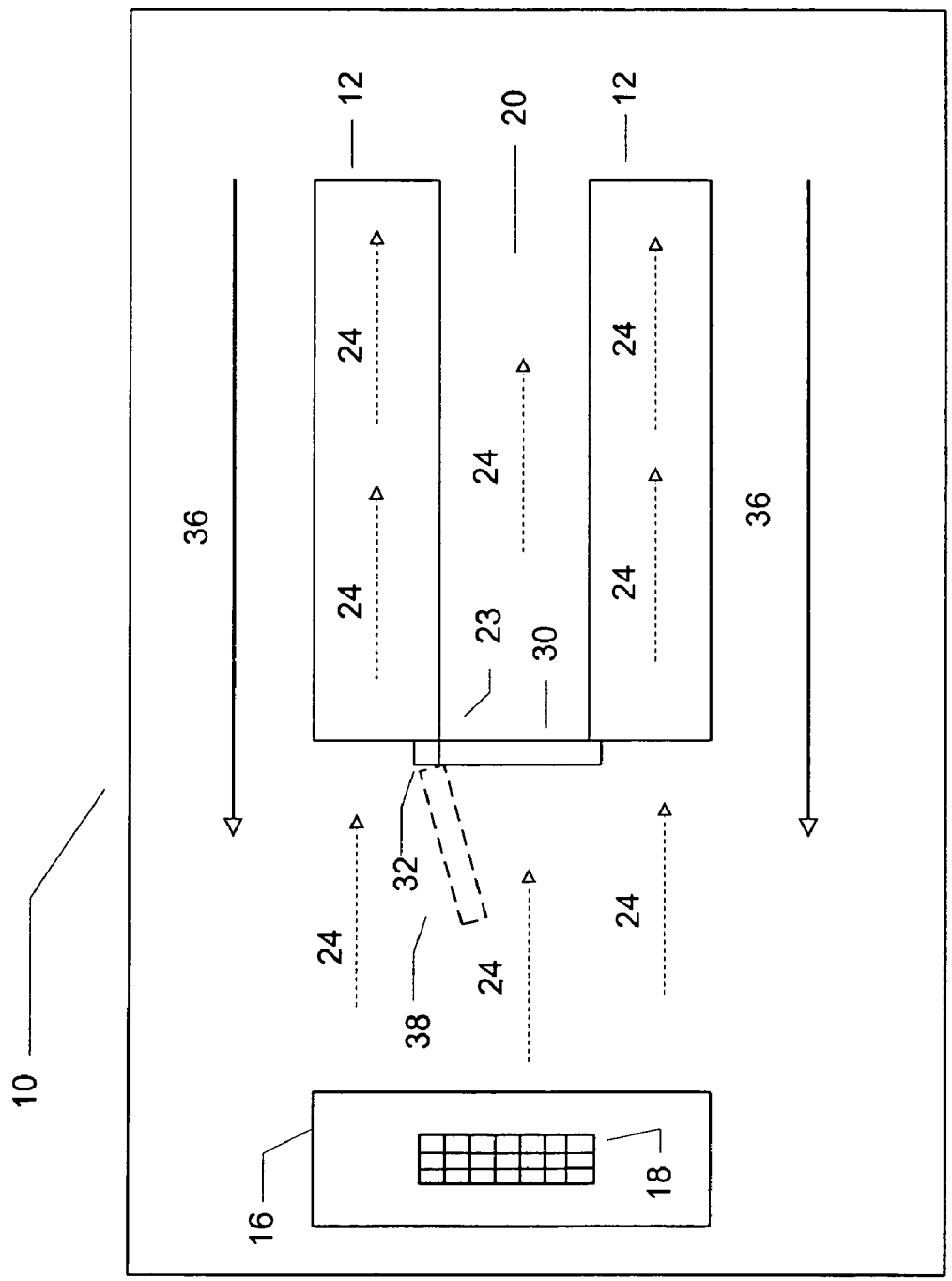
FIG. 1 illustrates an overhead view of the data center room depicting the circulation path taken by air within the data center room.
Figure 2:
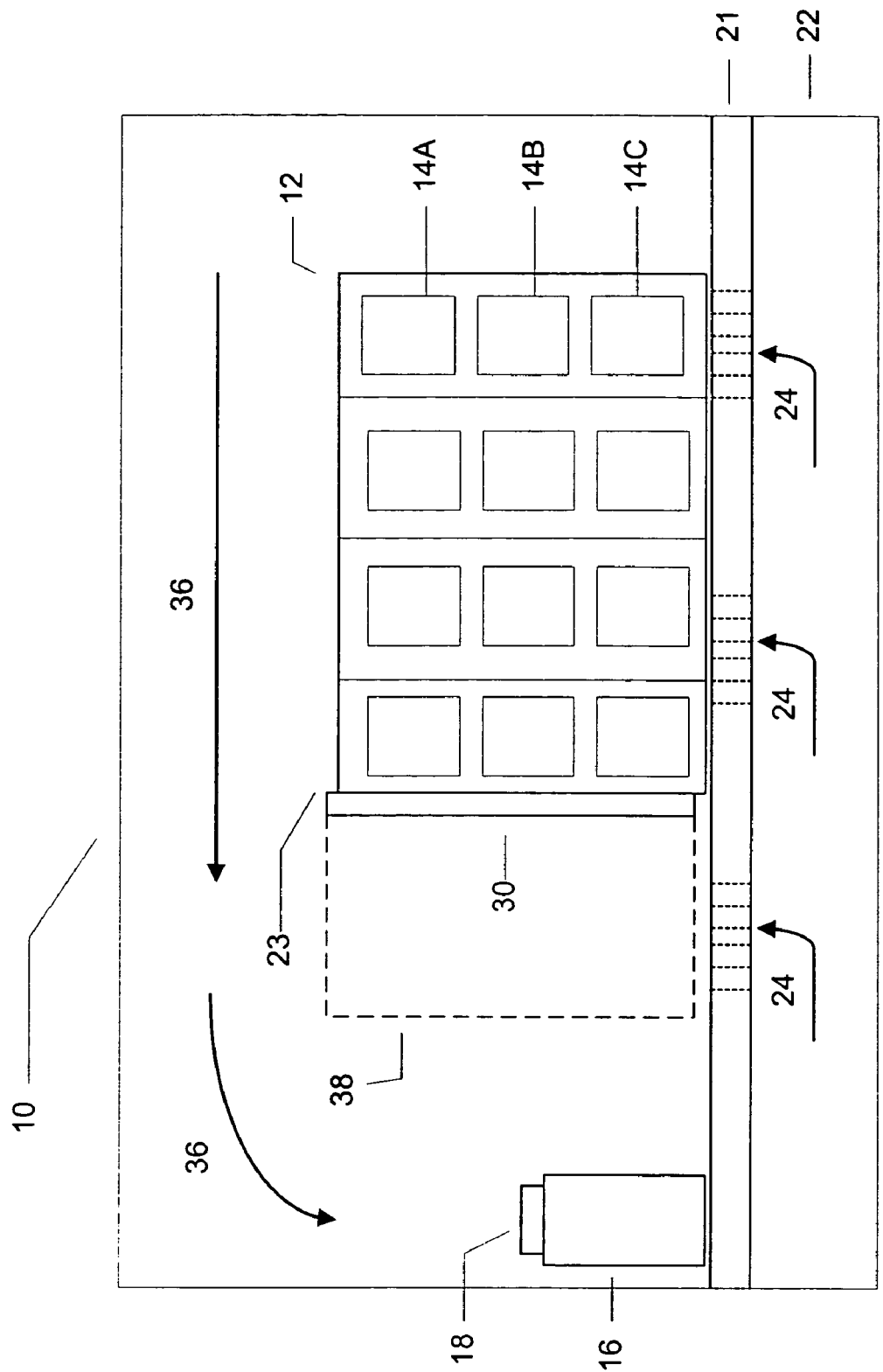
FIG. 2 illustrates a side view of the data center room depicting the circulation path taken by air within the data center room.

FIG. 1 is an overhead view of one embodiment of a data center room. FIG. 2 is a side view of the data center room of FIG. 1. Referring to FIG. 1 and FIG. 2, data center room 10 comprises perforated floor 21, air intake area 18, air cooling unit 16, cooling air passageway 22, racks 12, cold aisle 20, and deflector 30. Air from data center room 10 is drawn into air intake area 18 and cooled by air cooling unit 16. Cooling air 24 leaves air cooling unit 16 and is directed in the direction of cooling air passageway 22. Cooling air 24 then exits cooling air passageway 22 by passing through perforated floor 21 in cold aisle 20 and in the area of racks 12. Racks 12 are used to physically mount devices 14A-14C. Devices 14A-14C may comprise computer systems (e.g., servers), power supplies, etc.

Once air exits perforated floor 21, deflector 30 prevents cooling air 24 from flowing along cold aisle 20 back to air intake area 18 without providing cooling to all devices 14A-14C. In one embodiment, deflector 30 is mounted to an open end of cold aisle 23 by a mounting device 32 to reduce the amount of cooling air that travels back to air intake area 18 prior to being in proximity to provide cooling to devices 14A-14C. Due to the deflection, the air is more likely to travel up to and through racks 12, rather than along cold aisle 20. Once the air has risen to a height above either deflector 30 or racks 12, the air returns to air intake area 18 along a route depicted by arrows 36.

The use of deflector 30 results in an increased amount of cooling air being drawn into and by devices 14A-14C. In addition, the deflection of air causes a reduction in the re-circulation of heated air (re-circulation of heated air through open end of cold aisle 23 back into cold aisle 20) between devices 14A-14C.

In one embodiment, mounting device 32 couples deflector 30 to racks 12. In another embodiment, deflector 30 may comprise a mounting device 32 that is not coupled to racks 12 but positions deflector 30 with respect to racks 12 to reduce the flow of cooling air back to air intake area 18 without passing devices 14A-14C. In FIG. 1 and FIG. 2, deflector 30 is shown in an alternative position 38, which allows access to and egress from cold aisle 20. In one embodiment, mounting device 32 comprises a mechanism for coupling deflector 30 to racks 12 so that deflector 30 may be moved between the position where deflector 30 deflects air and alternate position 38. In one embodiment, a spring may be used to return deflector 30 to its initial position after it has been moved. It would be apparent to one of ordinary skill in the art that many variations for mounting and incorporating motion to deflector 30 are possible.

Figure 3:
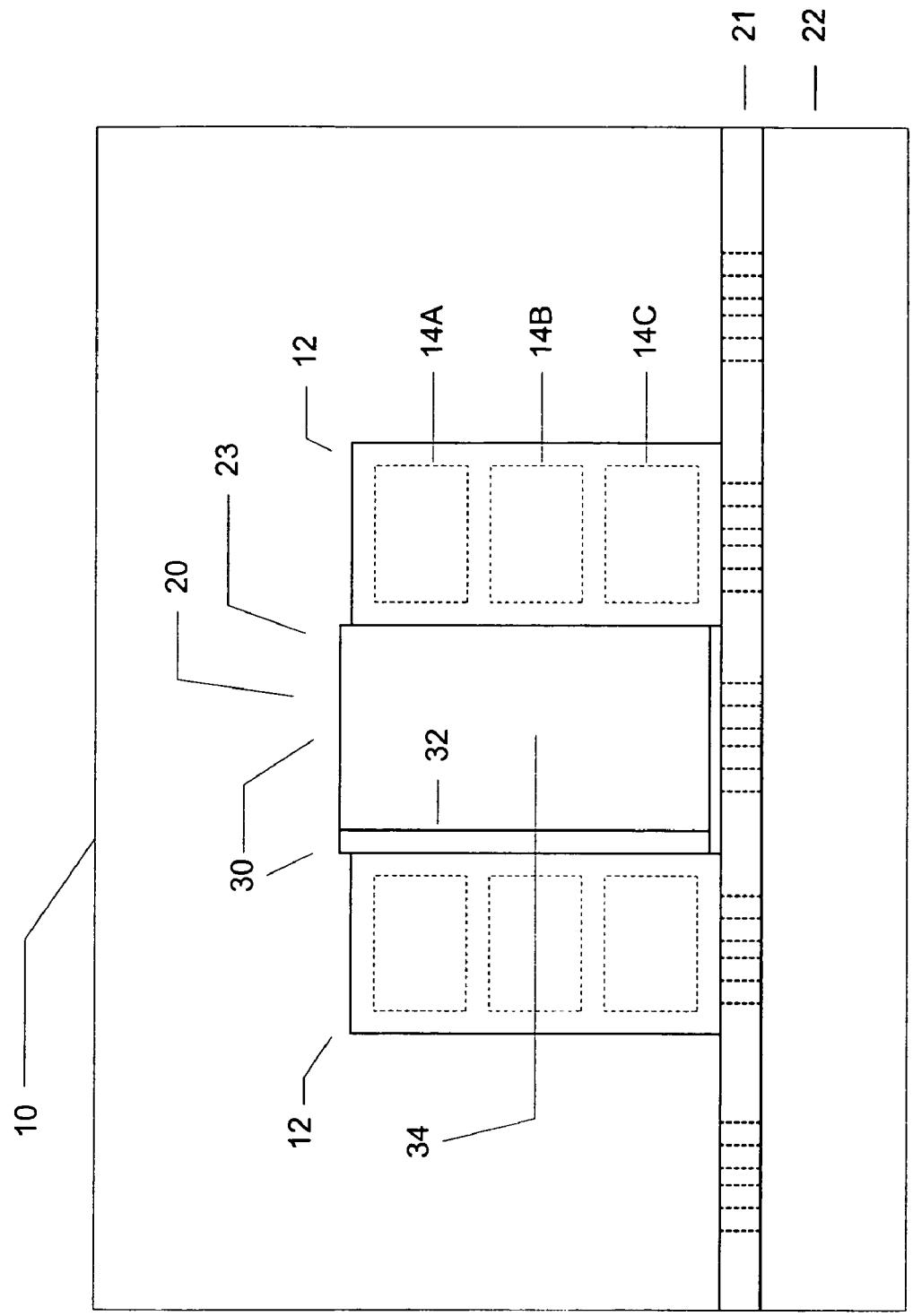
FIG. 3 illustrates an end view of the data center room depicting a deflector being mounted to a rack and positioned at the open end of a cold aisle.

FIG. 3 is an end view of one embodiment of a data center room. Referring to FIG. 3, data center room 10 comprises racks 12 where devices 14A-14C are mounted, perforated floor 21 above cooling air passageway 22, cold aisle 20 with open end of cold aisle 23, and deflector 30 comprising material 34 that is secured by mounting device 32. In one embodiment, material 34 may be metal, plastic, or wood, or a combination of these or other materials. In one embodiment, material 34 is transparent, for example, made of glass or clear plastic. There are numerous types of transparent material that may be used. In one embodiment, deflector 30 may comprise a flexible material, for example, a sheet of flexible plastic.

In one embodiment, deflector 30 is mounted in such a manner that deflector 30 transverses cold aisle 20, where the height of deflector 30 is initially at an angle perpendicular to perforated floor 21, and the width of deflector 30 is perpendicular to the longitudinal axis of cold aisle 20 and parallel to the ends of one or more racks 12. In one embodiment, the dimensions of deflector 30 are such that the width of deflector 30 exceeds the width of cold aisle 20, and the height of deflector 30 is approximately the height of the difference between perforated floor 21 and the height of racks 12 that form cold aisle 20. The dimensions of deflector 30 may be less than or greater than these dimensions.

Deflector 30 may be placed at any position in data center room 10 where it will deflect air in a manner that increases the efficiency of devices 14A-14C in data center room 10, or increases the efficiency of the cooling system itself, or both. In one embodiment, deflector 30 is placed at open end of cold aisle 23 closest to air intake return 18. In one embodiment, deflector 30 is placed at a position away from the open end of cold aisle 23. In one embodiment, two or more deflectors may be positioned within a single cold aisle. Many configurations for positioning deflectors within a data center room are possible.

Deflector 30 may be mounted in a manner so that deflector 30 may be moved to allow a person to enter or exit cold aisle 20. In one embodiment, deflector 30 is mounted in a manner that allows deflector 30 to rotate about a vertical axis perpendicular to perforated floor 21 and adjacent to a vertical edge of deflector 30.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method for controlling air circulation within a room having an aisle between racks with computer systems mounted thereon, comprising:
   supplying cooling air to computer systems in the racks via holes in a floor of the room;
   drawing the cooling air towards an air intake of a cooling unit; and
   providing a vertical deflector at an open end of the aisle to reduce a flow of the cooling air towards the air intake of the cooling unit prior to the cooling air being in proximity of the computer systems, wherein the deflector is positioned between the aisle and the air intake of the cooling unit, the deflector operable to displaceable force air over the top edge of deflector.

2. The method defined in claim 1 further comprising securing the deflector to prevent the deflector from creating an obstruction of access to and egress from the aisle, the deflector alternately displaceable to permit the access and egress.

3. The method in claim 1 wherein the deflector transverses the aisle in a plane perpendicular to a floor and perpendicular to a front or back side of one or more of the racks.

4. The method of claim 2 wherein the deflector extends from approximately the floor level to approximately the height of one or a plurality of objects that form the aisle.

5. The method of claim 1 wherein the deflector comprises a sheet of material.

6. The method of claim 1 wherein the deflector comprises a flexible curtain.

7. The method of claim 1 wherein all or parts of the deflector are transparent.

8. The method of claim 1 wherein a mounting device couples the deflector to one or more of the racks.

9. The method of claim 7 wherein the mounting device comprises a mechanism to allow movement of the deflector.

10. The method of claim 1 further comprising providing access to and egress from the aisle comprises rotation of the deflector around a vertical axis.

11. A system for cooling one or more devices in a room, the system comprising:
    a pair of racks supporting the devices and positioned to form an aisle there between;
    a perforated floor coupled to the pair of racks;
    an air cooling unit having an air intake and coupled to the perforated floor to push cooling air up through the perforated floor to the aisle; and
    a vertical deflector positioned at an open end of the aisle to reduce a flow of the cooling air towards the air intake of the cooling unit prior to the cooling air being in proximity of the devices, wherein the deflector is positioned between the aisle and the air intake of the cooling unit, the deflector operable to displacably force air over the top edge of the deflector, and further operable to prevent recirculation of cooled air from bypassing devices to be cooled.

12. The system of claim 11 wherein the deflector transverses the aisle in a plane perpendicular to a floor and perpendicular to a front or back side of one or more of the racks.

13. The system of claim 11 wherein the deflector extends from approximately the floor level to approximately the height of one or a plurality of objects that form the aisle.

14. The system of claim 11 wherein the deflector comprises a sheet of material.

15. The system of claim 11 wherein the deflector comprises a flexible curtain.

16. The system of claim 11 wherein all or parts of the deflector are transparent.

17. The system of claim 11 wherein a mounting device couples the deflector to one or more of the racks.

18. The system of claim 17 wherein the mounting device comprises a mechanism to allow movement of the deflector.

19. The method of claim 1, further comprising a plurality of deflectors disposed in a circumferential arrangement with the devices, the circumferential arrangement operable to enclose a perimeter of horizontal egress.

20. The method of claim 19 wherein enclosed perimeter defines a vertical barrier below which cooled air diverts to the devices.

21. A method for controlling air circulation within a room having an aisle between racks with computer systems mounted thereon, comprising:
    supplying cooling air to computer systems in the racks via holes in a floor of the room;
    drawing the cooling air towards an air intake of a cooling unit;
    providing at least one vertical deflector at an open end of the aisle to reduce a flow of the cooling air towards the air intake of the cooling unit prior to the cooling air being in proximity of the computer systems, wherein the deflector is positioned between the aisle and the air intake of the cooling unit, the deflector operable to displacably force air over the deflector, and further operable to prevent recirculation of cooled air from bypassing devices to be cooled; and
    securing the deflector to prevent the deflector from creating an obstruction of access to and egress from the aisle, the deflector alternately displaceable to permit the access and egress, the deflectors disposed in a circumferential arrangement with the devices, the circumferential arrangement operable to enclose a perimeter of horizontal egress for directing the air to the devices.

22. The system of claim 11 wherein providing access to and egress from the aisle comprises rotation of the deflector around a vertical axis.

* * * * *